(12) United States Patent
Tabatake et al.

(10) Patent No.: US 12,004,402 B2
(45) Date of Patent: Jun. 4, 2024

(54) DISPLAY DEVICE

(71) Applicant: Japan Display Inc., Tokyo (JP)

(72) Inventors: Hiroshi Tabatake, Tokyo (JP); Tetsuo Morita, Tokyo (JP); Yasuhiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 450 days.

(21) Appl. No.: 17/474,228

(22) Filed: Sep. 14, 2021

(65) Prior Publication Data
US 2021/0408165 A1  Dec. 30, 2021

Related U.S. Application Data

(63) Continuation of application No. PCT/JP2019/049828, filed on Dec. 19, 2019.

(30) Foreign Application Priority Data

Mar. 22, 2019  (JP) .................... 2019-054605

(51) Int. Cl.
| | | |
|---|---|---|
| *H10K 59/35* | (2023.01) | |
| *G09F 9/30* | (2006.01) | |
| *G09F 9/302* | (2006.01) | |
| *G09G 3/3208* | (2016.01) | |
| *G09G 3/3233* | (2016.01) | |
| *H05B 33/12* | (2006.01) | |
| *H10K 50/00* | (2023.01) | |
| *H10K 59/121* | (2023.01) | |

(52) U.S. Cl.
CPC ......... *H10K 59/353* (2023.02); *G09G 3/3208* (2013.01)

(58) Field of Classification Search
CPC .............. G09G 3/3208; G09G 3/3233; G09G 2310/0251; G09G 2310/0262; H10K 50/00; H10K 59/353; H10K 59/1216; G09F 9/30; G09F 9/302; H05B 33/12
See application file for complete search history.

(56) References Cited

U.S. PATENT DOCUMENTS

2019/0013372 A1*  1/2019  Yasukawa ............ H10K 59/122
2019/0088200 A1   3/2019  Woo et al.

OTHER PUBLICATIONS

Japanese Office Action dated Apr. 11, 2023, for the corresponding Japanese Patent Application No. 2019-054605, with English machine translation.

* cited by examiner

*Primary Examiner* — Antonio B Crite
(74) *Attorney, Agent, or Firm* — Michael Best & Friedrich LLP (57) ABSTRACT

A drive circuit includes a holding capacitor, an element capacitor, and an additional capacitor interposed between one of the source and the drain, and one of the high-potential line and the low-potential line. The drive circuit configured to drive the first light emitter includes a first element capacitor as the element capacitor and a first additional capacitor as the additional capacitor. The driving circuit configured to drive the second light emitter includes a second element capacitor as the element capacitor and a second additional capacitor as the additional capacitor. The first element capacitor is larger in capacitance than the second element capacitor. The first additional capacitor is smaller in capacitance than the second additional capacitor.

5 Claims, 13 Drawing Sheets

Cs : Cs₁,Cs₂
Cel : Cel₁>Cel₂
Cad : Cad₁<Cad₂
EL : LE1,LE2

DISPLAY DEVICE

CROSS-REFERENCE TO RELATED APPLICATION

This application is a continuation application of International Application PCT/JP2019/049828 filed on Dec. 19, 2019, which claims priority from Japanese patent application JP2019-054605 filed on Mar. 22, 2019. The contents of these applications are incorporated herein by reference in their entirety.

BACKGROUND

1. Field

This disclosure relates to a display device.

2. Description of the Related Art

An organic electroluminescence display device is configured to emit light at multiple gradations in a light-emitting layer by drawing a current corresponding to an input image signal, thereby displaying an image (JP 2019-16504A). The current is controlled by a thin film transistor.

To control the current by the thin film transistor, potential stability is important. This is why capacitance is formed using a pixel electrode as one electrode, whereas the one electrode varies in size for each emission color, leading to difference in the capacitance for each emission color. The difference in the capacitance makes a difference in the current control by the thin film transistor. Further, failure to display a black-dot, where no current flows, leads to contrast deterioration.

SUMMARY

This disclosure aims at elimination of difference in current control by a thin film transistor.

A display device includes: some light emitters at respective sub-pixels in respective emission colors, the sub-pixels constituting each of a plurality of pixels; and a drive circuit being configured to drive each of the light emitters. The light emitters include a first light emitter corresponding to one of the emission colors and a second light emitter corresponding to another of the emission colors. The first light emitter is larger in a light-emitting region than the second light emitter. The drive circuit includes: a high-potential line and a low-potential line, configured to draw a current to a corresponding one of the light emitters; a current switch configured to switch between flow and shutoff of the current; a thin film transistor connected in series with the current switch to control amount of the current; a signal switch configured to switch between input and shutoff of a video signal to a gate of the thin film transistor; a holding capacitor interposed between the gate and one of a source and a drain of the thin film transistor; an element capacitor composed of a corresponding one of the light emitters; and an additional capacitor interposed between the one of the source and the drain, and one of the high-potential line and the low-potential line. The drive circuit configured to drive the first light emitter includes a first element capacitor as the element capacitor and a first additional capacitor as the additional capacitor. The driving circuit configured to drive the second light emitter includes a second element capacitor as the element capacitor and a second additional capacitor as the additional capacitor. The first element capacitor is larger in capacitance than the second element capacitor. The first additional capacitor is smaller in capacitance than the second additional capacitor.

The first light emitter is larger in the light-emitting region than the second light emitter, whereby the first element capacitor is larger and the first additional capacitor is smaller. This enables elimination of the difference in the current control between the first light emitter and the second light emitter.

DETAILED DESCRIPTION

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings, and the repeated description will be omitted.

Further, in the detailed description, "on" or "under" in definition of positional relations of certain constituents, and other constituents includes not only a case in which a constituent is located just on or just under a certain constituent but also a case in which another constituent is interposed between constituents unless otherwise mentioned.

Figure 1:
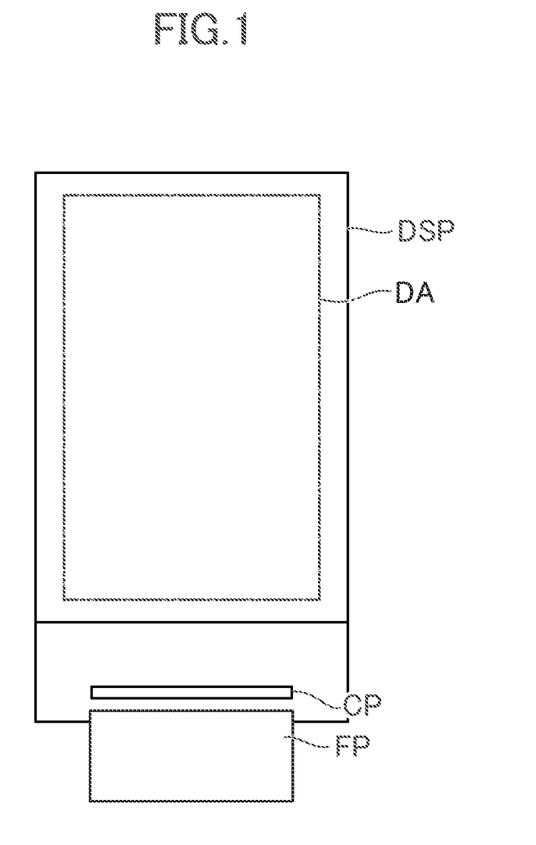
FIG. 1 is a plan view of a display device in an embodiment.
Figure 2:
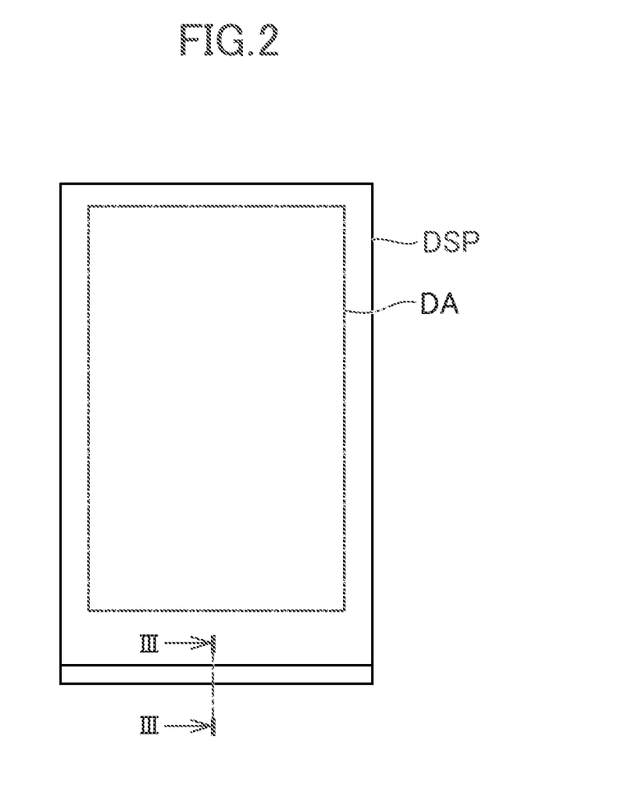
FIG. 2 is a schematic view of how to use the display device.
Figure 3:
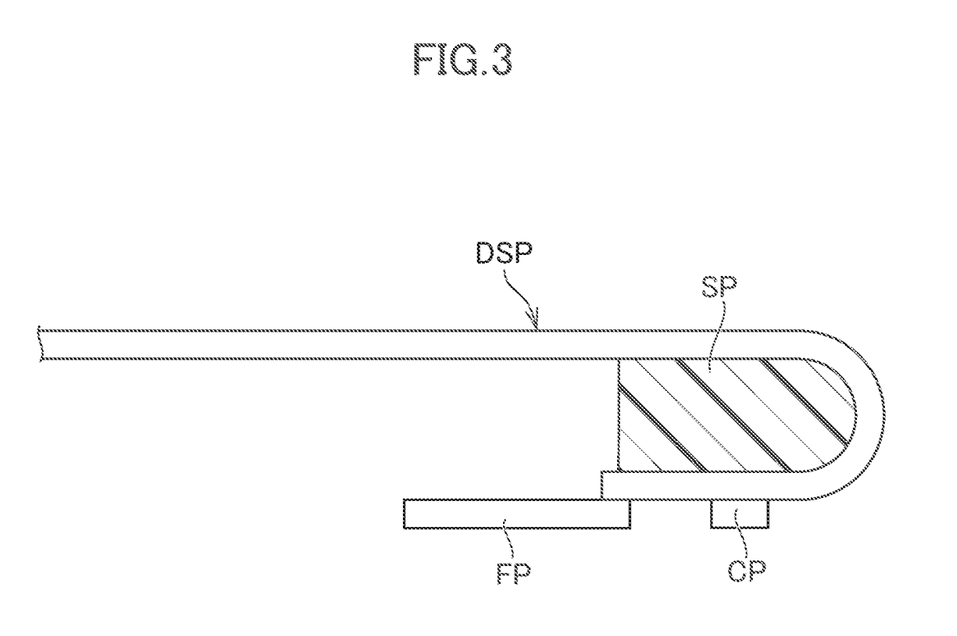
FIG. 3 is a III-III line schematic cross-sectional view of the display device in FIG. 2.

FIG. 1 is a plan view of a display device in an embodiment. The display device is actually bent to be used, so FIG. 1 is a development view before the display device is bent. FIG. 2 is a schematic view of how to use the display device. FIG. 3 is a III-III line schematic cross-sectional view of the display device in FIG. 2.

The display device is, for example, an organic electroluminescent display device. The display device includes a display DSP. A spacer SP is disposed inside the bend to prevent the display DSP from being bent too much. The display DSP is flexible and bent outside the display area DA in which images are displayed. An integrated circuit chip CP, for driving components for displaying the images, is mounted on the display DSP. A flexible printed circuit board FP is connected to the display DSP outside the display area DA.

Figure 4:
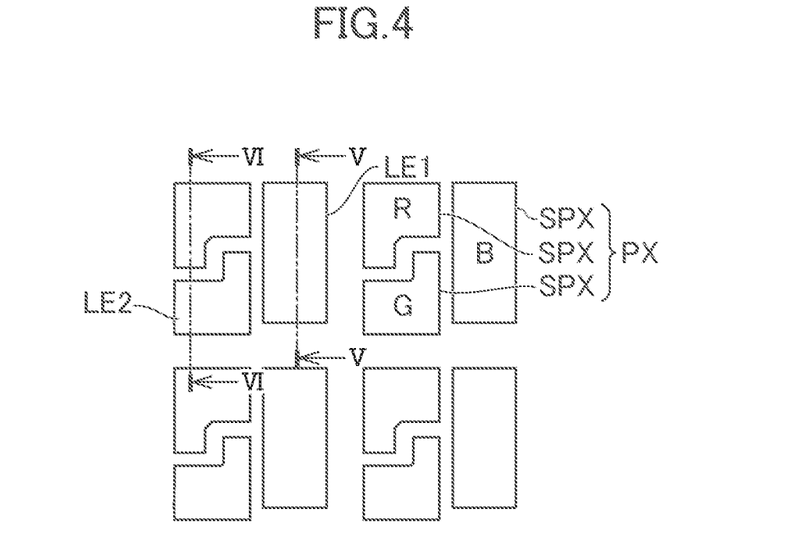
FIG. 4 is a partial view of the display area in FIG. 1.

FIG. 4 is a partial view of the display area in FIG. 1. In the display area DA, for example, some sub-pixels SPX in respective emission colors such as red R, green G, and blue B are combined to form each of a plurality of pixels PX in full-color to display a full-color image. Due to low sensitivity of human eyes to blue B, the sub-pixel SPX in the blue B is largest.

Figure 5:
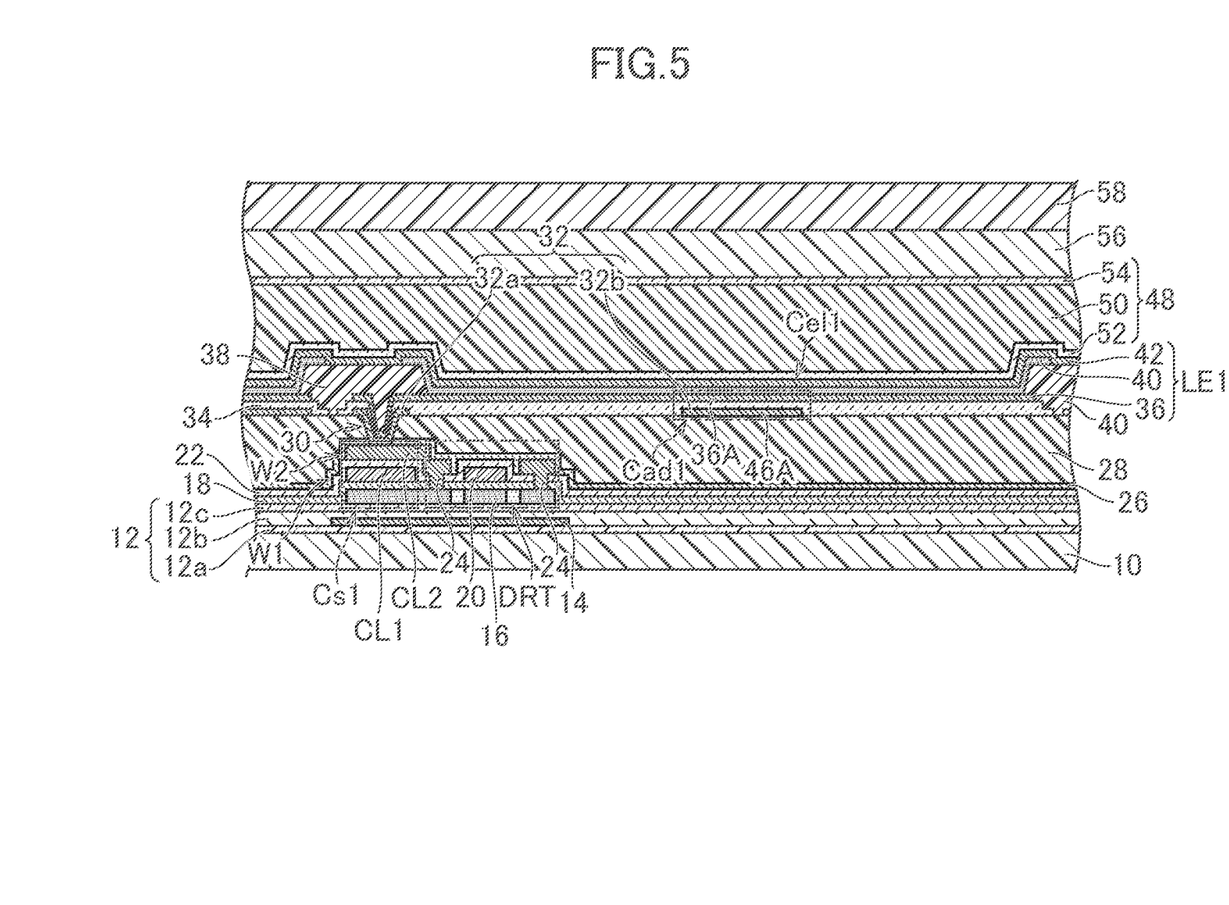
FIG. 5 is a V-V line cross-sectional view of the display device in FIG. 1.

FIG. 5 is a V-V line cross-sectional view of the display device in FIG. 1. Specifically, it is a cross-sectional view of the sub-pixel SPX in the blue B among the emission colors. The substrate 10 is made of polyimide. However, any other resin material may be used as long as it is a base material having sufficient flexibility for forming a sheet display or a flexible display.

A barrier inorganic film 12 (undercoat layer) is laminated on the substrate 10. The barrier inorganic film 12 has a three-layer laminated structure consisting of a silicon oxide film 12a, a silicon nitride film 12b, and a silicon oxide film 12c. The lowest silicon oxide film 12a is for improving adhesion to the substrate 10, the middle silicon nitride film 12b is for a block film against moisture and impurities from the outside, the uppermost silicon oxide film 12c is for a block film to prevent hydrogen atoms contained in the silicon nitride film 12b from diffusing toward the semiconductor layer 16 of the thin film transistor DRT, although this structure is changeable, another layer may be further laminated, or a single layer or a double layer lamination is applicable.

A functional film 14 may be formed at a position for forming the thin film transistor DRT. The functional film 14 can suppress change in characteristics of the thin film transistor DRT possibly due to penetration of light from the back of the channel, or can provide a predetermined potential by being formed from a conductive material to give a back gate effect to the thin film transistor DRT. Here, after the silicon oxide film 12a is formed, the functional film 14 is formed in an island shape in accordance with the position for forming the thin film transistor DRT, and then the silicon nitride film 12b and the silicon oxide film 12c are laminated, so that the functional film 14 is sealed in the barrier inorganic film 12; instead, the functional film 14 may be formed first on the substrate 10, and then the barrier inorganic film 12 may be formed.

The thin film transistor DRT is formed on the barrier inorganic film 12. A polysilicon thin film transistor is exemplified here, and only an N-channel transistor is shown, but a P-channel transistor may also be formed. The semiconductor layer 16 of the thin film transistor DRT has a structure in which a low concentration impurity region is provided between a channel region and a source/drain region. A silicon oxide film is used here as a gate insulating film 18. A gate electrode 20 is part of a first wiring layer W1 formed of MoW. The first wiring layer W1 has a first holding capacitance line CL1 in addition to the gate electrode 20. There is a portion of a holding capacitor Cs between the first holding capacitance line CL1 and the semiconductor layer 16 (source/drain region), via the gate insulating film 18.

There is an interlayer insulating film 22 (silicon oxide film, silicon nitride film) laminated on the gate electrode 20.

There is a second wiring layer W2, including a portion serving as a source/drain electrode 24, on the interlayer insulating film 22. Here, a three-layer laminated structure of Ti, Al, and Ti is employed. The first holding capacitance line CL1 (part of the first wiring layer W1) and the second holding capacitance line CL2 (part of the second wiring layer W2), via the interlayer insulating film 22, constitute another part of the holding capacitor Cs.

There is a passivation film 26 on the interlayer insulating film 22 to cover the second wiring layer W2 (source/drain electrode 24). There is a flattening organic film 28 on the passivation film 26. The flattening organic film 28 is superior in surface flatness to inorganic insulating materials possibly formed by chemical vapor deposition (CVD), therefore resins such as photosensitive acrylic are used.

The flattening organic film 28 and the passivation film 26 are removed at the pixel contact portion 30, and an indium tin oxide (ITO) film 32 is formed thereon. The indium tin oxide film 32 includes a first transparent conductive film 32a and a second transparent conductive film 32b separated from each other. The second wiring layer W2, the surface of which is exposed by the removal of the flattening organic film 28 and the passivation film 26, is covered with the first transparent conductive film 32a. A silicon nitride film 34 is provided on the flattening organic film 28 to cover the first transparent conductive film 32a. The silicon nitride film 34 has an opening at the pixel contact portion 30, and a pixel electrode 36 is laminated to be electrically continuous to the source/drain electrode 24 through the opening. The pixel electrode 36 is formed as a reflective electrode, and has a three-layer laminated structure of an indium zinc oxide film, an Ag film, and an indium zinc oxide film. Here, an indium tin oxide film may be used instead of the indium zinc oxide film. The pixel electrode 36 extends laterally from the pixel contact portion 30 and to above the thin film transistor DRT.

The second transparent conductive film 32b is adjacent to the pixel contact portion 30, and is disposed below the pixel electrode 36 (further below the silicon nitride film 34). The second transparent conductive film 32b, the silicon nitride film 34, and the pixel electrode 36 overlap with each other and constitute a first additional capacitor Cad1. The first additional capacitor Cad1 includes a first counter electrode 46A opposed to the pixel electrode 36.

On the flattening organic film 28, for example, above the pixel contact portion 30, an insulating organic film 38 called a bank (rib) and serving as a partition wall of the adjacent pixel regions is formed. The insulating organic film 38 may be formed from photosensitive acrylic just like the flattening organic film 28. The insulating organic film 38 has an opening to expose the surface of the pixel electrode 36 as a light emitting region, and its open end should be in a gently tapered shape. A steep shape of the open end causes poor coverage of the organic electroluminescence layer 40 formed thereon.

The flattening organic film 28 and the insulating organic film 38 are in contact with each other through an opening provided in the silicon nitride film 34 between them. Therefore, moisture and gas desorbed from the flattening organic film 28 can be extracted through the insulating organic film 38 during heat treatment after the formation of the insulating organic film 38.

An organic electroluminescence layer 40 made of organic materials is laminated on the pixel electrode 36. The organic electroluminescence layer 40 may be a single layer, or may have a structure in which a hole transport layer, a light emitting layer, and an electron transport layer are laminated in this order from the pixel electrode 36. These layers may be formed by evaporation.

There is a common electrode 42 on the organic electroluminescence layer 40. Because of a top emission structure being employed here, the common electrode 42 is transparent. For example, an Mg layer and an Ag layer are formed as a thin film enough to pass light emitted from the organic electroluminescence layer 40. According to the order of formation of the organic electroluminescence layer 40 described above, the pixel electrode 36 is an anode, and the common electrode 42 is a cathode. A first light emitter LE1 is composed of the plurality of pixel electrodes 36, the common electrode 42, and the organic electroluminescence layer 40 interposed between the central portion of each pixel electrode 36 and the common electrode 42. The first light emitter LE1 constitutes a first element capacitor Cel1.

There is a sealing layer 48, covering the first light emitter LE1, on the common electrode 42. The sealing layer 48 has a function of preventing external moisture from entering the organic electroluminescence layer 40 previously formed, and is required to have a high gas barrier property. The sealing layer 48 has a laminated structure consisting of an organic film 50, and a first inorganic film 52 and a second inorganic film 54 (e.g., silicon nitride films) sandwiching the organic film 50. A resin layer 56 and a polarizing plate 58 (e.g., circular polarizing plate) are laminated on the sealing layer 48.

Figure 6:
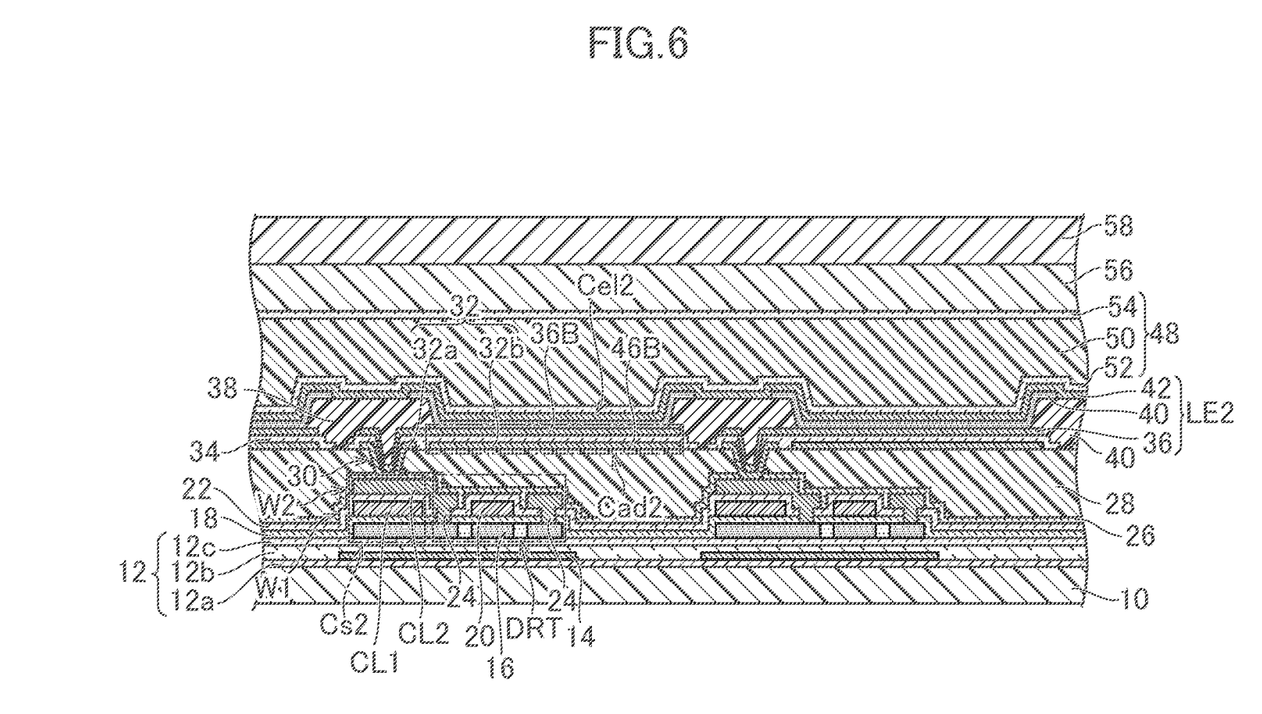
FIG. 6 is a VI-VI line cross-sectional view of the display device in FIG. 1.

FIG. 6 is a VI-VI line cross-sectional view of the display device in FIG. 1. Specifically, it is a cross-sectional view of the sub-pixels SPX in the red R and the green G among the emission colors. The second light emitter LE2 constitutes a second element capacitor Cel2. The first light emitter LE1 in FIG. 5 is larger in the light-emitting area than the second light emitter LE2 in FIG. 6 (refer to FIG. 4). Specifically, the pixel electrode 36 of the first light emitter LE1 is larger in a planar area than the pixel electrode 36 of the second light emitter LE2.

The pixel electrode 36 that is one electrode 36A of the first additional capacitor Cad1 in FIG. 5 is larger in a planar area than the pixel electrode 36 that is one electrode 36B of the second additional capacitor Cad2 in FIG. 6. The second additional capacitor Cad2 includes a second counter electrode 46B opposed to the pixel electrode 36 (one electrode 36B). The first counter electrode 46A (FIG. 5) included in the first additional capacitor Cad1 is smaller in a planar area than the second counter electrode 46B (FIG. 6) included in the second additional capacitor Cad2. Other configurations are the same as what is shown in FIG. 5.

Figure 7:
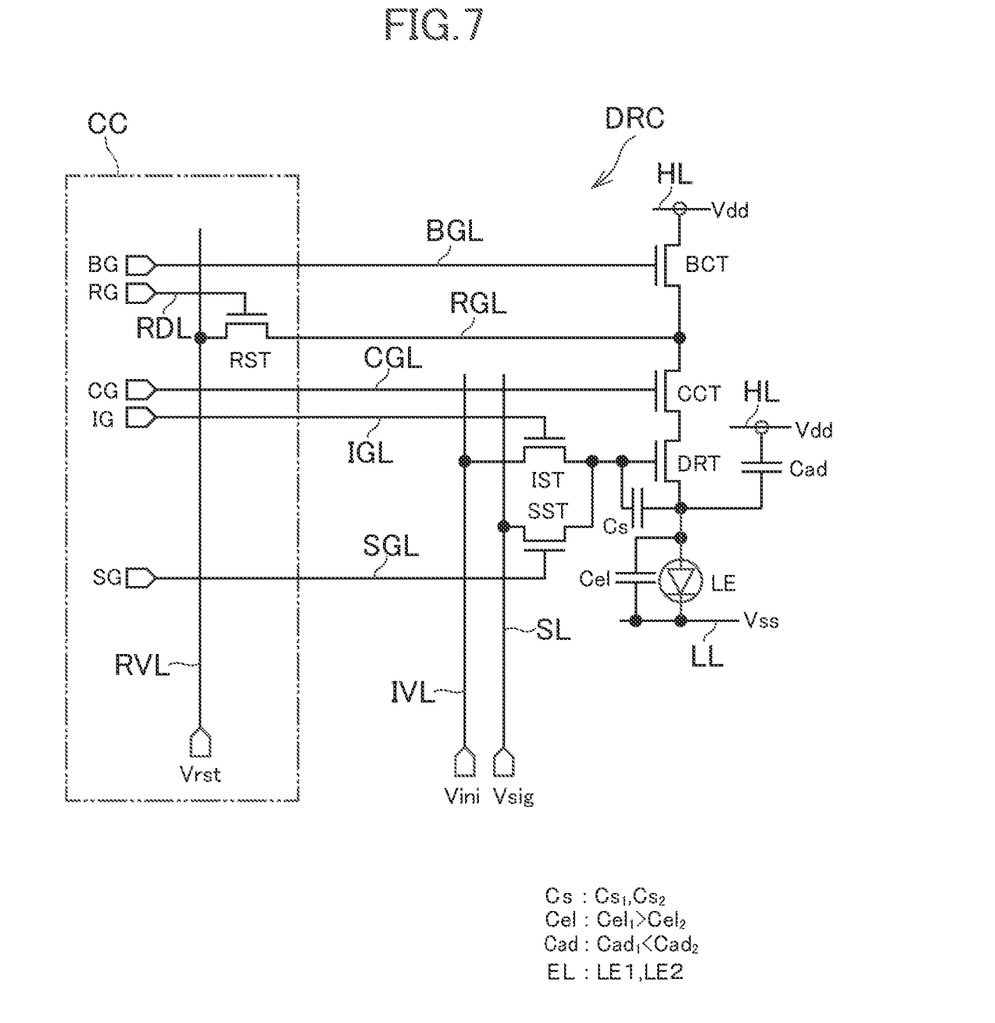
FIG. 7 is a detailed view of a drive circuit.

FIG. 7 is a detailed view of a drive circuit. The light emitters LE include a first light emitter LE1 (FIG. 5) corresponding to one of the emission colors R, G, B. The light emitters LE include a second light emitter LE2 (FIG. 6) corresponding to another of the emission colors R, G, B. The display device has the light emitters LE provided in the respective sub-pixels SPX, in the respective emission colors R, G, B, constituting each of the plurality of pixels PX. The display device has a drive circuit DRC configured to drive each of the light emitters LE.

By the potential difference between a high-potential line HL and a low-potential line LL, a current can flow through each of the light emitters LE. A current switch BCT is configured to switch between flow and shutoff of the current. A thin film transistor DRT is connected in series with the current switch BCT, to control amount of the current. A signal switch SST is configured to switch between input and shutoff of a video signal Vsig to a gate of the thin film transistor DRT. The holding capacitor Cs is interposed between the gate and one of a source and a drain, of the thin film transistor DRT.

Each light emitter LE constitutes an element capacitor Cel. The element capacitor Cel is a capacitor between the anode (pixel electrode 36) and the cathode (common electrode 42) of the light emitter LE. The drive circuit DRC configured to drive the first light emitter LE1 in FIG. 5 includes a first element capacitor Cel1 as the element capacitor Cel. The drive circuit DRC configured to drive the second light emitter LE2 in FIG. 6 includes a second element capacitor Cel2 as the element capacitor Cel. Each pixel electrode 36 serves as both one electrode 36A and one electrode 36B of the element capacitor Cel and the additional capacitor Cad, respectively. The one electrode 36A is larger in the planar area than the one electrode 36B, whereby the first element capacitor Cel1 is larger in capacitance than the second element capacitor Cel2.

The drive circuit DRC includes an additional capacitor Cad interposed between one of the source and the drain, and one of the high-potential line HL and the low-potential line LL. The drive circuit DRC configured to drive the first light emitter LE1 in FIG. 5 includes a first additional capacitor Cad1 as the additional capacitor Cad. The drive circuit DRC configured to drive the second emitter LE2 in FIG. 6 includes a second additional capacitor Cad2 as the additional capacitor Cad.

The first counter electrode 46A is smaller in the planar area than the second counter electrode 46B, whereby the first additional capacitor Cad1 is smaller in capacitance than the second additional capacitor Cad2. The first element capacitor Cel1 and the first additional capacitor Cad1 are equal in total capacitance to the second element capacitor Cel2 and the second additional capacitor Cad2.

In this embodiment, as compared with the second light emitter LE2 in FIG. 6, the first light emitter LE1 in FIG. 5 has the first element capacitor Cel1 large in the capacitance, due to the large light-emitting area, but has the first additional capacitor Cad1 small in the capacitance. This can eliminate difference in current control between the first light emitter LE1 and the second light emitter LE2.

Signals BG, CG, IG, SG are output from a control circuit CC to a light control line BGL, a correction control line CGL, an initialization control line IGL, and a write control line SGL, respectively. The drive circuit DRC has a current switch BCT, a correction transistor CCT, an initialization transistor IST, a signal switch SST, and the thin film transistor DRT. At least one of these transistors may be shared by adjacent driver circuits DRC. The holding capacitor Cs is provided between the gate and the source of the thin film transistor DRT.

The current switch BCT, the correction transistor CCT, the initialization transistor IST, and the signal switch SST each function as a switch for selecting conduction and non-conduction between two nodes. The thin film transistor DRT functions as a current controller that controls current value flowing through the light emitter LE in accordance with its gate-source voltage. The transistors used may be N-type transistors or P-type transistors. To use the P-type transistors, power supply potential and connection of holding capacity should be appropriately adapted.

The anode of the light emitter LE is connected, through the current switch BCT, the correction transistor CCT and the thin film transistor DRT, to the high-potential line HL at high potential (power supply voltage Vdd). The cathode is connected to the low-potential line LL at low potential (power supply voltage Vss).

Figure 8:
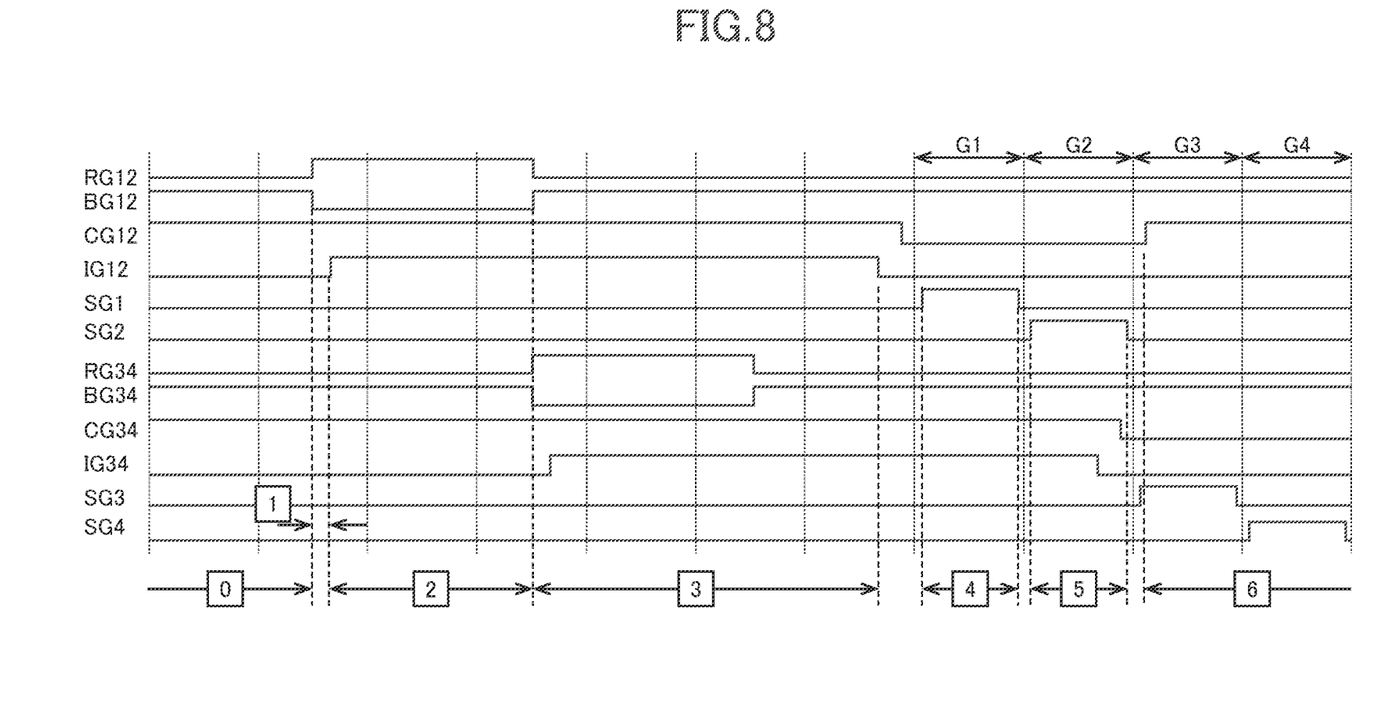
FIG. 8 is a timing chart of a control circuit CC for driving the drive circuit DRC.

FIG. 8 is a timing chart of a control circuit CC for driving the drive circuit DRC. In this embodiment, the signals RG, BG, CG, IG are simultaneously input to the drive circuits DRC arranged in two rows, where the two-digit numbers attached behind the symbols RG, BG, CG, IG each indicate a row number of the input signals. A single-digit number behind the symbol SG indicates a row number of the input signal. Each interval denoted by one of symbols G1 to G4 is one horizontal period, and the same timing relationship continues until the last row, though omitted hereafter. In FIG. 8, Periods 0 to 6 will be described in detail below.

[Light Emission in Previous Frame]

In FIG. 8, during a period (Period 0) until start of processing in a certain frame period, the light emitter LE keeps a light-emitting state of a previous frame.

[Source Initialization of Thin Film Transistor DRT]

Figure 9:
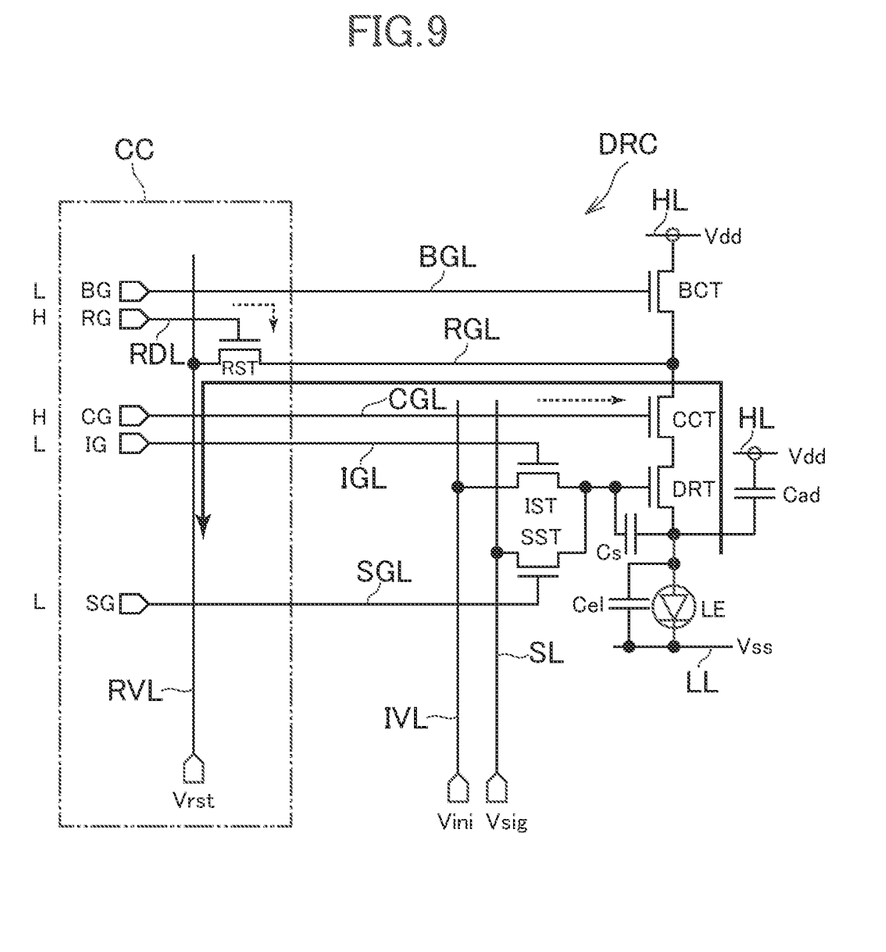
FIG. 9 is a diagram of an operation in Period 1 in FIG. 8.

FIG. 9 is a diagram of an operation in Period 1 in FIG. 8. In this period, initially, the signal BG is at L-level, the signal CG is at H-level, and the signal RG is at H-level, whereby the current switch BCT is turned off, and the correction transistor CCT is turned on. The signal RG goes to H-level, and the reset transistor RST is turned on through the reset drive line RDL. The reset transistor RST is provided outside the display area DA, for example, one in each row. The current from the power supply voltage Vdd is cut off by the current switch BCT, whereby the light emitter LE stops emitting light. Charge remaining close to the anode of the light emitter LE is pulled out to the reset potential line RVL through the reset control line RGL and the reset transistor RST. Thus, the source of the thin film transistor DRT is fixed to the reset potential Vrst. The reset potential Vrst, compared to the power supply voltage Vss, is set to a potential lower than the emission start voltage of the light emitter LE.

[Gate Initialization of Thin Film Transistor DRT]

Figure 10:
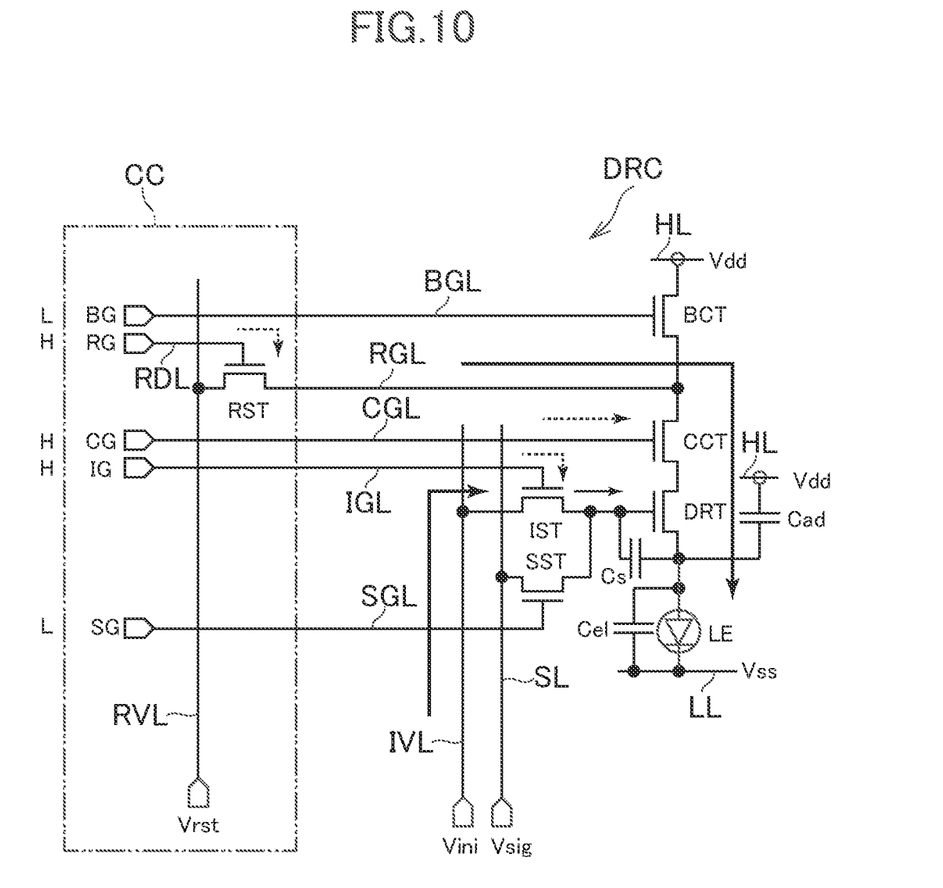
FIG. 10 is a diagram of an operation in Period 2 in FIG. 8.

FIG. 10 is a diagram of an operation in Period 2 in FIG. 8. In this period, the signal IG goes to H-level, and the initialization transistor IST is turned on. Thus, the gate of the thin film transistor DRT is fixed to the initialization potential Vini through the initialization potential line IVL. The initialization potential Vini is set to potential higher than the threshold value Vth of the thin film transistor DRT, compared to the reset potential Vrst. That is, this operation turns on the thin film transistor DRT. However, the current switch BCT is off, so no current still yet flows in the thin film transistor DRT.

[Offset Cancellation]

Figure 11:
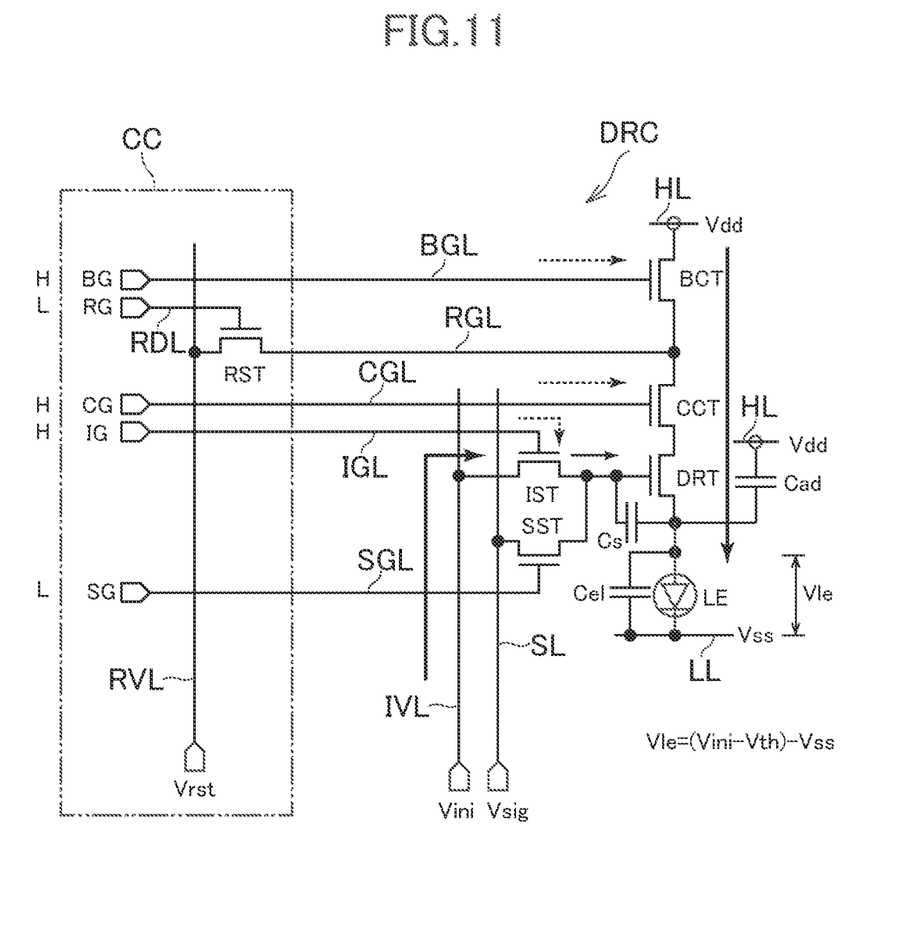
FIG. 11 is a diagram of an operation in Period 3 in FIG. 8.

FIG. 11 is a diagram of an operation in Period 3 in FIG. 8. In this period, the signal BG is at H-level, and the signal RG is at L-level, whereby the current switch BCT is turned on, and the reset transistor RST is turned off. The thin film transistor DRT is on by the previous operation, whereby the current is drawn from the power supply voltage Vdd, through the current switch BCT and the correction transistor CCT, to the thin film transistor DRT.

At this stage, no current flows because the voltage between the anode and the cathode of the light emitter LE does not exceed the emission start voltage. Accordingly, the current drawn from the power supply voltage Vdd charges the source of the thin film transistor DRT to raise the potential. The gate potential of the thin film transistor DRT is now at the initialization potential Vini, whereby the thin film transistor DRT is turned off when the source potential of the thin film transistor DRT goes to (Vini minus Vth), and the source potential stops rising.

The threshold voltage Vth of the thin film transistor DRT varies depending on each drive circuit DRC, whereby the source potential of the thin film transistor DRT, when the potential stops rising, varies depending on each drive circuit DRC. That is, in this operation, a voltage corresponding to the threshold voltage Vth of each thin film transistor DRT is acquired between the source and the gate at each drive circuit DRC.

Between the anode and the cathode of the light emitter LE, the voltage Vle calculated from {(Vini minus Vth) minus Vss} is now applied, but this voltage is not above the emission start voltage yet, and no current flows to the light emitter LE.

Incidentally, the timing chart in FIG. 8 shows that the operations, from the source initialization of the thin film transistor DRT (Period 1) to the offset cancellation (Period 3), are carried out in parallel for the drive circuits DRC in two rows, although this is not limited thereto. The operations may be performed for each row consecutively, or for three or more rows simultaneously.

[Video Signal Writing]

Figure 12:
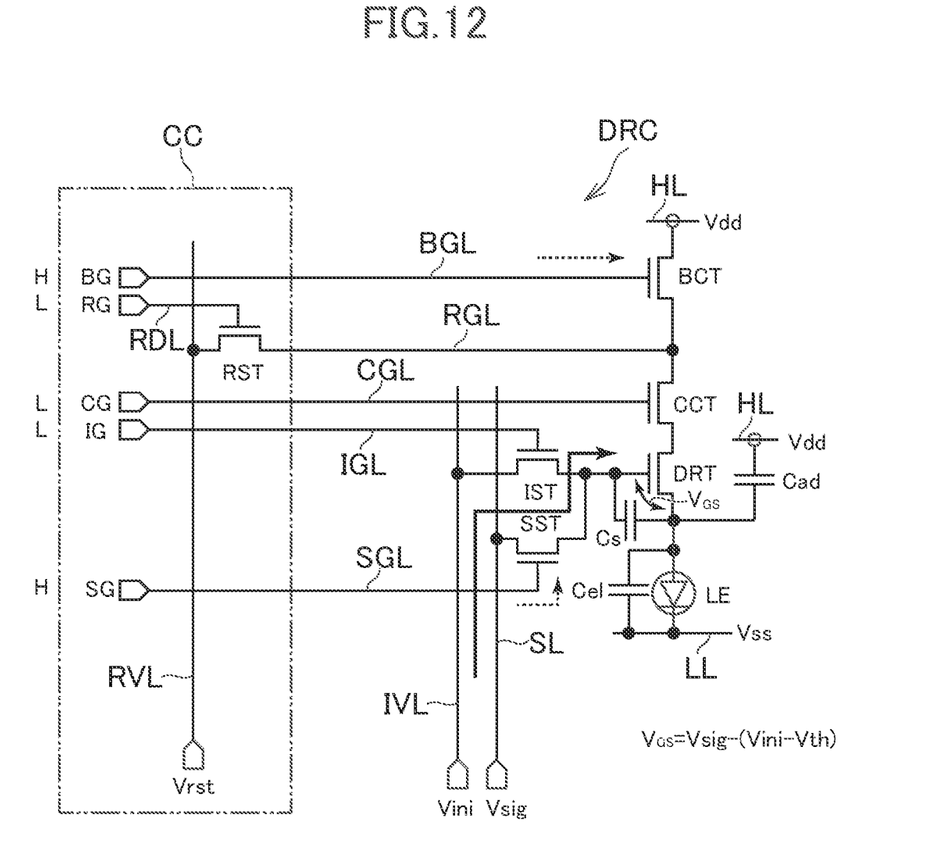
FIG. 12 is a diagram of an operation in Periods 4 and 5 in FIG. 8.

FIG. 12 is a diagram of operation in Periods 4 and 5 in FIG. 8. In these periods, the signal CG is at L-level, the signal IG is at L-level, and the signal SG is at H-level, whereby the correction transistor CCT is turned off, the initialization transistor IST is turned off, and the signal switch SST is turned on. Thus, the video signal Vsig is input to the gate of the thin film transistor DRT, and the gate potential of the thin film transistor DRT changes from the initialization potential Vini to the video signal Vsig. That is, the video signal Vsig is written to the gate of the thin film transistor DRT.

Now, the source potential of the thin film transistor DRT is at potential (Vini minus Vth) corresponding to the value of the threshold voltage Vth through the previous offset cancelation (Period 3). Therefore, in spite of writing the same video signal Vsig, the gate-source voltage $V_{GS}$ of the thin film transistor DRT is at {Vsig minus (Vini minus Vth)} reflecting on the variation of the threshold voltage Vth. That is, in spite of the variation of the threshold voltage Vth for each drive circuit DRC, corrected writing is possible accordingly.

Writing to the first row is carried out in Period 4, and writing to the second row is carried out in Period 5. Similarly, after completion of writing to the even-numbered row, writing to the odd-numbered row is carried out. During the writing to the even-numbered row, the signal switch SST is turned off in the odd-numbered row to be in the "wait" state. One video signal line SL is common to some drive circuits DRC arranged in different rows but in the same column, whereby the video signal Vsig is shared, and the video signal writing operation is sequentially performed for each row.

[Light Emission]

Figure 13:
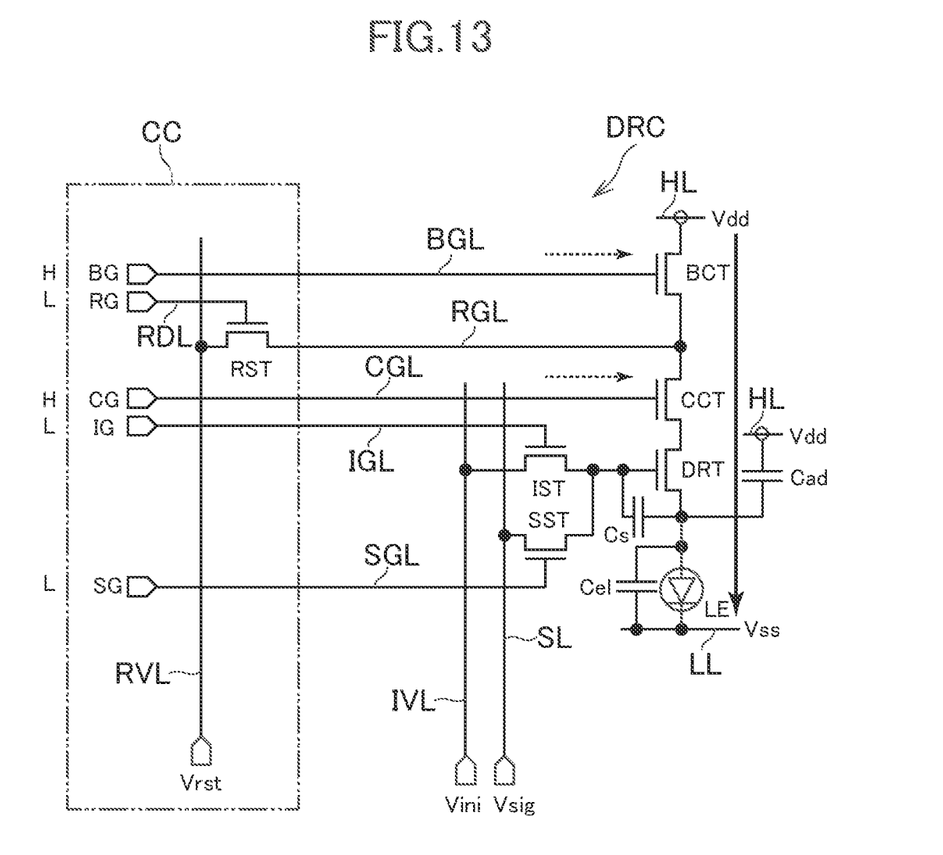
FIG. 13 is a diagram of an operation in Period 6 in FIG. 8.

FIG. 13 is a diagram of operation in Period 6 in FIG. 8. In this period, the signal CG is at H-level, and the signal SG is at L-level, whereby the correction transistor CCT is turned on, and the signal switch SST is turned off. A current is drawn from the power supply voltage Vdd to the thin film transistor DRT through the current switch BCT and the correction transistor CCT.

In the thin film transistor DRT, a current corresponding to the gate-source voltage $V_{GS}$ set before the previous stage flows to the light emitter LE, and the light emitter LE emits light with brightness corresponding to the current. The anode-cathode voltage of the light emitter LE is now at the voltage corresponding to the current, the potential close to the anode goes up, and the gate-source voltage of the thin film transistor DRT is held by the holding capacitor Cs. By coupling the holding capacitor Cs, the gate potential of the thin film transistor DRT also goes up.

Actually, the additional capacitor Cad and other parasitic capacitors as well as the holding capacitor Cs are attached to the gate of the thin film transistor DRT, whereby the gate potential of the thin film transistor DRT rises slightly less than the anode side. Since this value is known, the potential of the video signal Vsig should be determined in accordance with the desired current value in response to the final gate-source voltage of the thin film transistor DRT.

Thus, the operations in sequence are completed. When the operations are completed from the first line to the last line, one image in one frame period is displayed. Thereafter, another video image is displayed by repeating the operations.

The embodiments described above are not limited and different variations are possible. The structures explained in the embodiments may be replaced with substantially the same structures and other structures that can achieve the same effect or the same objective.

What is claimed is:

1. A display device comprising:
    light emitters at respective sub-pixels in respective emission colors, the sub-pixels constituting each of a plurality of pixels; and
    a drive circuit being configured to drive each of the light emitters,
    wherein
    the light emitters include a first light emitter corresponding to one of the emission colors and a second light emitter corresponding to another of the emission colors,
    the first light emitter is larger in a light-emitting region than the second light emitter,
    the drive circuit includes:
        a high-potential line and a low-potential line, configured to draw a current to a corresponding one of the light emitters;
        a current switch configured to switch between flow and shutoff of the current;
        a thin film transistor connected in series with the current switch to control amount of the current;
        a signal switch configured to switch between input and shutoff of a video signal to a gate of the thin film transistor;
        a holding capacitor interposed between the gate and one of a source and a drain of the thin film transistor;
        an element capacitor composed of a corresponding one of the light emitters; and
        an additional capacitor interposed between the one of the source and the drain, and one of the high-potential line and the low-potential line,
    the drive circuit configured to drive the first light emitter includes a first element capacitor as the element capacitor and a first additional capacitor as the additional capacitor,
    the driving circuit configured to drive the second light emitter includes a second element capacitor as the element capacitor and a second additional capacitor as the additional capacitor,
    the first element capacitor is larger in capacitance than the second element capacitor, and
    the first additional capacitor is smaller in capacitance than the second additional capacitor.

2. The display device according to claim 1, wherein the first element capacitor and the first additional capacitor are equal in total capacitance to the second element capacitor and the second additional capacitor.

3. The display device according to claim 1, wherein
    the light emitters include respective pixel electrodes,
    each of the pixel electrodes serves as one electrode of each of the element capacitor and the additional capacitor, and
    the additional capacitor includes a counter electrode opposed to the one electrode.

4. The display device according to claim 3, wherein an area of the one electrode included in the first additional capacitor is larger than that of the one electrode included in the second additional capacitor in a planar view.

5. The display device according to claim 3, wherein an area of the counter electrode included in the first additional capacitor is smaller than that of the counter electrode included in the second additional capacitor in a planar view.

* * * * *